United States Patent
Bhattacharya et al.

(10) Patent No.: US 7,382,168 B2
(45) Date of Patent: Jun. 3, 2008

(54) BUFFER CIRCUIT WITH MULTIPLE VOLTAGE RANGE

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US); Yehuda Smooha, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 8 days.

(21) Appl. No.: 11/215,663

(22) Filed: Aug. 30, 2005

(65) Prior Publication Data

US 2007/0046338 A1 Mar. 1, 2007

(51) Int. Cl.
*H03B 1/00* (2006.01)

(52) U.S. Cl. .................. 327/112; 327/365; 326/38; 326/62

(58) Field of Classification Search .......... 327/99, 327/108–110, 112, 333, 365, 403, 404, 407–410, 327/518, 520, 526, 603; 326/81–83; 330/262
See application file for complete search history.

(56) References Cited

U.S. PATENT DOCUMENTS

| | | | | |
|---|---|---|---|---|
| 5,404,056 A * | 4/1995 | Maeda | | 326/84 |
| 5,650,741 A * | 7/1997 | Nakamura et al. | | 327/327 |
| 5,723,986 A * | 3/1998 | Nakashiro et al. | | 326/81 |
| 5,739,700 A * | 4/1998 | Martin | | 326/80 |
| 6,023,175 A * | 2/2000 | Nunomiya et al. | | 326/68 |
| 6,222,385 B1 * | 4/2001 | Kang | | 326/68 |
| 6,346,829 B1 * | 2/2002 | Coddington | | 326/81 |
| 6,377,069 B1 * | 4/2002 | Veenstra et al. | | 326/38 |
| 6,377,508 B1 * | 4/2002 | Tomishima et al. | | 365/230.06 |
| 6,512,420 B1 * | 1/2003 | Eker et al. | | 331/57 |
| 6,674,304 B1 * | 1/2004 | Matthews | | 326/80 |
| 6,819,149 B2 * | 11/2004 | Shirasawa et al. | | 327/112 |
| 6,857,079 B2 * | 2/2005 | Chen | | 713/324 |
| 7,005,889 B2 * | 2/2006 | Sowden et al. | | 326/81 |
| 7,023,238 B1 * | 4/2006 | Camarota | | 326/38 |
| 7,030,681 B2 * | 4/2006 | Yamazaki et al. | | 327/534 |
| 7,196,542 B1 * | 3/2007 | Lee et al. | | 326/38 |
| 7,292,075 B2 * | 11/2007 | Abdel-Hamid et al. | | 327/111 |
| 7,292,217 B2 * | 11/2007 | Tseng et al. | | 345/100 |

\* cited by examiner

*Primary Examiner*—N. Drew Richards
*Assistant Examiner*—William Hernandez
(74) *Attorney, Agent, or Firm*—Ryan, Mason & Lewis, LLP

(57) ABSTRACT

A buffer circuit operative at multiple power supply voltage levels includes first and second buffers, the first buffer being configured for operation with a first voltage source and the second buffer being operative with a second voltage source. The buffer circuit further includes a controllable isolation circuit. An output of the first buffer connects to an external pad of the buffer circuit, and an output of the second buffer connects to the pad via the isolation circuit. The buffer circuit is selectively operative in at least a first mode or a second mode in response to at least a first control signal. The isolation circuit is operative in the first mode to substantially isolate the second buffer from the external pad and is operative in the second mode to connect the output of the second buffer to the external pad.

19 Claims, 3 Drawing Sheets

US 7,382,168 B2

BUFFER CIRCUIT WITH MULTIPLE VOLTAGE RANGE

FIELD OF THE INVENTION

The present invention relates generally to electronic circuits, and more particularly relates to buffer circuits.

BACKGROUND OF THE INVENTION

Buffer circuits (e.g., output buffers, input buffers, and bidirectional buffers) are employed in a variety of electronic devices and applications. Certain portable devices, including wireless handsets, notebook computers and personal digital assistants (PDAs), often employ circuitry which runs on two or more different voltage levels. For instance, circuitry utilized with such portable devices may be configured so that a portion of the circuitry, such as, for example, input/output (IO) buffers, runs at a higher power supply voltage level (e.g., about 3.3 volts), as may be supplied by an IO voltage source. Another portion of the circuitry, such as, for example, core logic, may run at a substantially lower power supply voltage level (e.g., about 1.0 volt), as may be supplied by a core voltage source.

There are many applications in which a buffer circuit (e.g., an IO buffer) may be required to operate over a wide range of power supply voltage levels. The level of the power supply voltage source may be determined by the particular application. From a performance standpoint (e.g., speed, power consumption, reliability, etc.), buffer circuits designed to handle a wide range of power supply voltage levels generally do so at the expense of circuit performance. For instance, it is well known that when the power supply voltage level becomes comparable to the core voltage source level, a standard 10 buffer circuit often produces an undesirable amount of skew and operates at a substantially slower speed.

Complementary metal-oxide-semiconductor (CMOS) bidirectional buffers that are required to work over a wide range of power supply voltages often have severe difficulty meeting speed requirements, and/or other requirements, in a low voltage (e.g., about 1.0 volt) range of operation. In an attempt to address this problem, one known approach is to employ a significantly large output buffer stage using transistors suitable for operation at the highest anticipated voltage level. The use of such large transistor sizes, typically several thousand micrometers in width, will cause the buffer size to grow accordingly, often to unacceptable limits, thereby significantly increasing a cost of the buffer circuit. In some applications, several hundred buffers may be required. Moreover, even with these very large sized transistors, a high-frequency operation of the buffers will be rather limited, due primarily to an increased gate capacitance of the large transistor devices.

Accordingly, there exists a need for an improved buffer circuit that does not suffer from one or more of the problems exhibited by conventional buffer circuits.

SUMMARY OF THE INVENTION

The present invention meets the above-noted need by providing, in an illustrative embodiment, a buffer circuit architecture capable of high-speed operation while in at least a high voltage power supply range (e.g., about 3.3 volts) and a low-voltage power supply range (e.g., about 1.0 volt), without the need for substantially large size transistors.

In accordance with one aspect of the invention, a buffer circuit comprises first and second buffers. The first buffer is configured for operation with a first voltage source having a first voltage level. An output node of the first buffer is adapted for connection to an external pad of the buffer circuit. The first buffer is adapted to receive an input signal or a first signal indicative of the input signal and to generate a first output signal which is a function of the input signal, the first output signal being referenced to the first voltage level. The second buffer is configured for operation with a second voltage source having a second voltage level, the first voltage level being greater than the second voltage level. The second buffer is adapted to receive the input signal or a second signal indicative of the input signal and to generate a second output signal which is a function of the input signal, the second output signal being referenced to the second voltage level. The buffer circuit further includes a controllable isolation circuit coupled between an output node of the second buffer and the external pad. The buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad. The external pad is driven by the first output signal in the first mode and is driven by the second output signal in the second mode.

In accordance with another aspect of the invention, an integrated circuit is provided including at least one buffer circuit configured as stated above.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative buffer circuits. It should be understood, however, that the present invention is not limited to these or any other particular circuit arrangements. Rather, the invention is more generally applicable to techniques for providing a buffer circuit capable of high-speed operation (e.g., about 1 megahertz (MHz) or greater) while in at least one of a high voltage power supply range (e.g., about 3.3 volts) and a low-voltage power supply range (e.g., about 1.0 volt), without the need for substantially large size transistors (e.g., greater than about 1000 micrometers). Although implementations of the present invention are described herein with specific reference to P-channel metal-oxide-semiconductor (PMOS) and N-channel metal-oxide-semiconductor (NMOS) transistor devices, as may be formed using a CMOS fabrication process, it is to be understood that the invention is not limited to such transistor devices and/or such a fabrication process, and that other suitable devices, such as, for example, bipolar junction transistors (BJTs), etc., and/or fabrication processes (e.g., bipolar, BiCMOS, etc.), may be similarly employed, as will be apparent to those skilled in the art.

Figure 1:
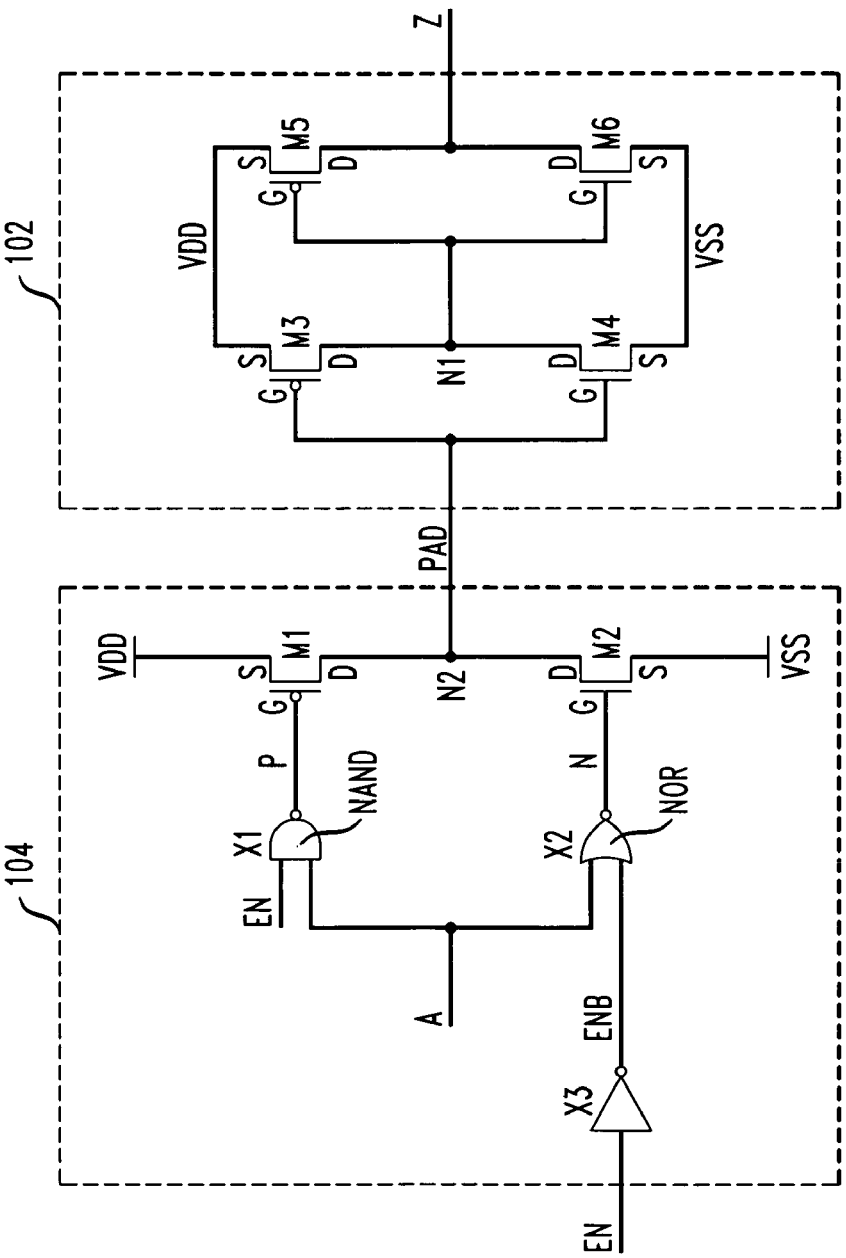
FIG. 1 is a schematic diagram illustrating a conventional CMOS bidirectional buffer circuit.

FIG. 1 is a schematic diagram illustrating a standard CMOS bidirectional buffer 100, including a first stage 102 and second stage 104. The first stage 102 consists of a pair of PMOS transistors M3 and M5, and a pair of NMOS transistors M4 and M6, which form two inverters that allow buffer signal PAD to drive signal Z. The signal PAD is generated as an output of the second stage 104 at node N2, which is a connection of the buffer 100 to the external environment. Specifically, a first inverter includes PMOS transistor M3 and NMOS transistor M4, and a second inverter includes PMOS transistor M5 and NMOS transistor M6. In the first inverter, a source (S) of transistor M3 is connected to supply voltage VDD, drains (D) of transistors M3 and M4 are connected together at node N1, gates (G) of M3 and M4 are connected together at node N2, and a source of M4 is connected to VSS (e.g., ground). Likewise, in the second inverter, a source of transistor M5 is connected to VDD, drains of transistors M5 and M6 are connected together and adapted to generate signal Z, gates of M5 and M6 are connected together at node N1, and a source of M6 is connected to VSS.

Second stage 104 consists of a PMOS transistor M1 connected between node N2 and VDD, and an NMOS transistor M2 connected between node N2 and VSS. Specifically, a source of transistor M1 is connected to VDD, drains of transistors M1 and M2 are connected together at node N2, and a source of M2 is connected to VSS. A logical NAND gate X1 generates a control signal, P, which is connected to a gate of transistor M1. A logical NOR gate X2 generates a control signal, N, which is connected to a gate of transistor M2. The NAND gate X1 receives, as inputs, a data signal A and an enable signal, EN, while NOR gate X2 receives, as inputs, the data signal A and a logical inversion of the enable signal, ENB, generated by an inverter X3.

When enable signal EN is set to a logic high ("1") level, NAND gate X1 and NOR gate X2 function as inverters for the data signal A, so that when signal A is a logic high level, control signals P and N are both a logic low ("0") level. Signals P and N being low turns on transistor M1 and turns off transistor M2, thereby setting the signal PAD at node N2 to a logic high level. Likewise, when signal A is a logic low level, signal P and signal N are both a logic high level. Signals P and N being high turns off transistor M1 and turns on transistor M2, thereby setting the signal PAD at node N2 to a logic low level. When enable signal EN is set to a logic low level, control signal P is a logic high level and control signal N is a logic low level, thereby turning off transistors M1 and M2, regardless of the state of data signal A. With M1 and M2 turned off, node N2 is in a high impedance state, and the buffer 100 functions as an input buffer.

Traditional mixed signal integrated circuit processes typically offer "high voltage" and "low voltage" transistor devices. The high voltage transistor devices generally have a nominal threshold voltage of about 0.75 volts and are intended to operate with a higher power supply voltage (e.g., about 3.3 volts). The low voltage transistor devices have a nominal threshold voltage which is substantially lower than the high voltage devices, such as, for example, about 0.35 volts, and are intended to operate with a lower core power supply voltage (e.g., about 1.0 volt). In order to conserve power, it is desirable that most of the core logic circuitry runs at the lower power supply voltage. The core logic circuitry typically employs low voltage transistors. However, in order to interface with other circuits external to a given IC device, at least a portion of the IC (e.g., IO buffer circuits) is required to run at the higher power supply voltage. The IO circuitry typically employs high voltage transistors.

To optimize performance in the low power supply voltage range, a low voltage transistor is often fabricated having a very thin gate oxide (e.g., about 15 to 20 Angstroms) and a very short gate length (e.g., about 0.1 to 0.15 micron). These low voltage transistors, however, cannot be subjected to the higher power supply voltage without potentially damaging the device. By contrast, high voltage transistors are typically fabricated having a thicker gate oxide (e.g., about 50 to 70 Angstroms) and longer gate length (e.g., about 0.3 to 0.5 micron) compared to low voltage transistors, enabling the high voltage transistors to operate at the higher power supply voltage without damage. However, the characteristics which allow these high voltage transistors to perform well in the higher power supply voltage range also cause these devices to perform poorly, if at all, in the lower power supply voltage range.

Buffer 100 is, of necessity, made with a specific type of transistor, namely, high voltage transistors, and is designed to run at the higher power supply voltage, typically about 3.3 volts. However, as previously stated, some applications may require the buffer 100 to meet certain specifications (e.g., speed) at the lower power supply voltage, typically about 1.0 volt, as well. For a standard buffer using high voltage transistors and designed for operation with a power supply voltage (e.g., VDD) of about 3.3 volts, VDD can be lowered to about 2 volts and the buffer will still perform reasonably well by increasing the sizes of the transistors to compensate for a reduced overdrive at 2 volts. This will significantly increase the size of the buffer. However, even when the sizes of the transistors in the buffer are significantly increased, the buffer will perform poorly, if at all, when VDD is dropped to about 1 volt, as this voltage level is too close to the threshold voltage of the high voltage transistors. Of course, although the buffer would perform well when VDD is at about 1 volt if low voltage transistors were used, such transistors would most likely be damaged, or at least have significantly impaired reliability, when VDD is raised to about 3 volts.

Figure 2:
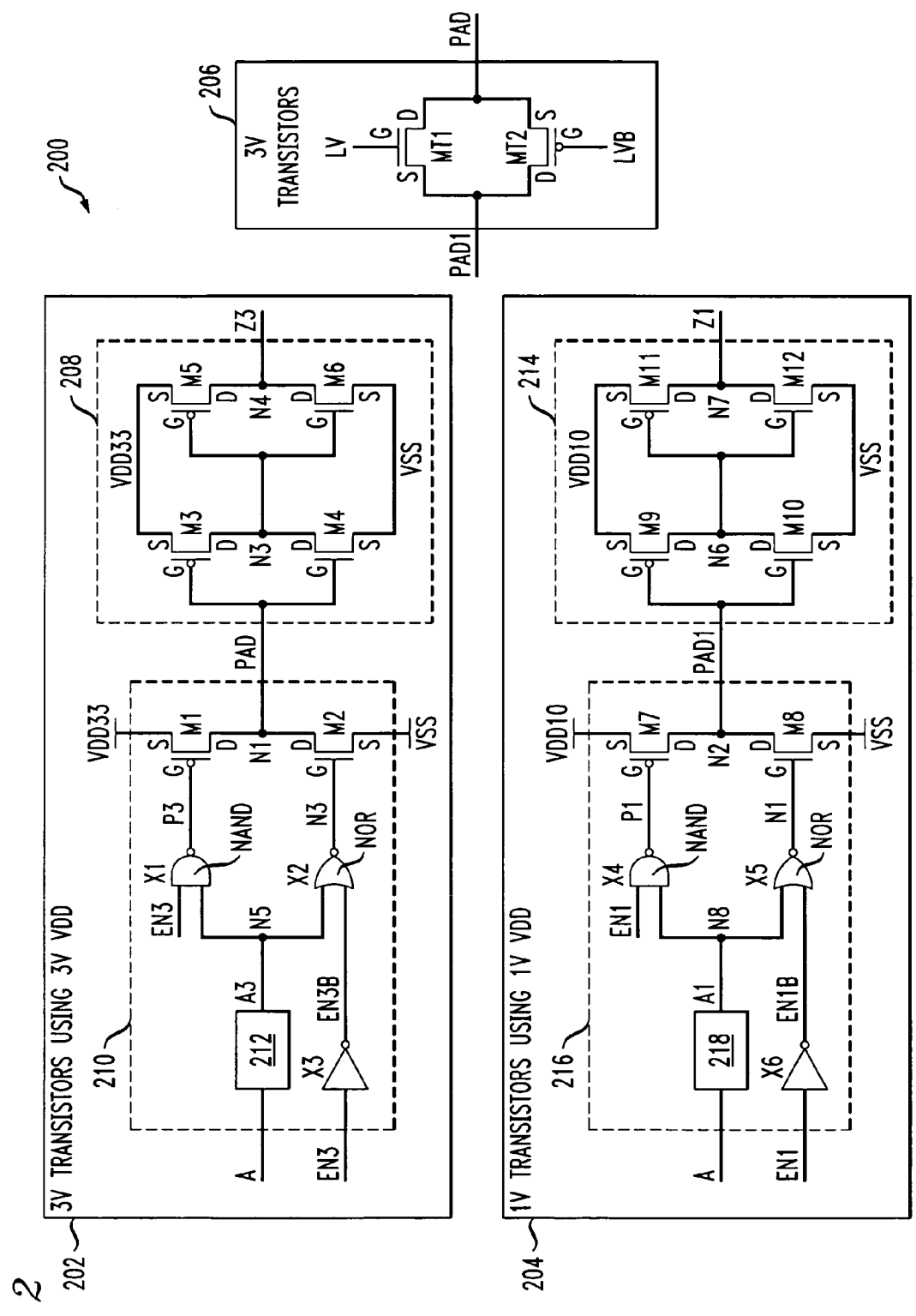
FIG. 2 is a schematic diagram depicting at least a portion of an exemplary bidirectional buffer circuit, formed in accordance with one embodiment of the present invention.

FIG. 2 is a schematic diagram illustrating an exemplary bidirectional buffer circuit 200 adapted for operation at multiple power supply voltage levels. The buffer circuit 200 preferably includes at least two parallel buffers, one buffer for each of the voltage levels at which the buffer circuit is to be used. In this manner, each of the buffers can be optimized for a particular supply voltage. One of the buffers is preferably connected directly to the external environment, for example, via an IO pad (not shown), while the other buffer is connected to the IO pad via an isolation circuit, as will be described in further detail below. When the buffer circuit 200 is configured for use as an output buffer, the IO pad may be used to convey an output signal generated by the buffer circuit to the external environment (e.g., another circuit, etc.), and when the buffer circuit is configured for use as an input buffer, the IO pad may be used to convey an external input signal to the buffer circuit. In the illustrative embodiment shown in FIG. 2, only two power supply voltage levels are employed, such as, for example, 1.0 volt and 3.3 volts, and hence the illustrative buffer circuit 200 comprises two parallel buffers. The buffer circuit 200, however, is not limited to the particular circuit arrangement shown, nor is it limited to operation at any particular number of voltage levels.

Buffer circuit 200 comprises a first buffer 202 employing high voltage (e.g., 3 volt) transistors and operating with a first voltage source, VDD33, having a first voltage level (e.g., 3.3 volts), and a second buffer 204 employing low voltage (e.g., 1 volt) transistors and operating with a second voltage source, VDD10, having a second voltage level (e.g., 1.0 volt) which is substantially less than the first voltage level. While the first and second voltage levels are preferably substantially constant, it is contemplated that these voltage levels may not be constant, as is sometimes the case when using an unregulated power supply. It is to be appreciated that the 3.3 volt and 1.0 volt levels used for the first and second voltage sources, VDD10 and VDD33, respectively, are illustrative only, and that the present invention is not limited to any particular voltage levels for the first and second voltage sources. Furthermore, the high and low voltage transistors are not limited to operation at any particular voltage level. The first buffer 202 generates an output signal, PAD, at node N1 which is adapted for connection directly to the IO pad, while the corresponding node N2 of the second buffer 204 generates an output signal, PAD1, which may be selectively connected to the IO pad via an isolation circuit 206, or alternative connection arrangement. The IO pad is preferably a connection of the buffer circuit 200 to the external environment (e.g., an integrated circuit bond pad, probe pad, interconnection node, etc.).

The first buffer 202 preferably comprises a first stage 208 and a second stage 210 coupled to the first stage. One or both of the first and second stages 208, 210, may be configured in a manner similar to the first and second stages, respectively, of buffer 100 depicted in FIG. 1, although alternative buffer configurations are contemplated by the invention. Specifically, first stage 208 preferably comprises a pair of PMOS transistors M3 and M5, and a pair of NMOS transistors M4 and M6, which form two inverters that allow a signal generated by the second stage 210 at node N1 to drive signal Z3 generated by the first stage 208, when the buffer 202 is employed as an output buffer. A first inverter includes PMOS transistor M3 and NMOS transistor M4, and a second inverter includes PMOS transistor M5 and NMOS transistor M6. In the first inverter, a source of transistor M3 is connected to supply voltage VDD33, drains of transistors M3 and M4 are connected together at node N3, gates of M3 and M4 are connected together at node N1, and a source of M4 is connected to VSS (e.g., ground). Likewise, in the second inverter, a source of transistor M5 is connected to VDD33, drains of transistors M5 and M6 are connected together at node N4 and generate signal Z3, gates of M5 and M6 are connected to the drains of M3 and M4 at node N3, and a source of M6 is connected to VSS.

The second stage 210 preferably includes a PMOS transistor M1 connected between node N1 and VDD33, and an NMOS transistor M2 connected between node N1 and VSS. Specifically, a first bias terminal (e.g., source) of transistor M1 is connected to VDD33, second bias terminals (e.g., drains) of transistors M1 and M2 are connected together at node N1, and a first bias terminal (e.g., source) of M2 is connected to VSS. A logical NAND gate X1 generates a control signal, P3, which is connected to a control terminal (e.g., gate) of transistor M1. A logical NOR gate X2 generates a control signal, N3, which is connected to a control terminal (e.g., gate) of transistor M2. The NAND gate X1 receives, as inputs, a data signal A3 at node N5 and an enable signal, EN3, while NOR gate X2 receives, as inputs, the data signal A3 and a logical inversion of the enable signal, EN3B, generated by an inverter X3.

Data signal A3 is essentially the logical equivalent of an input signal A presented to the buffer circuit 200, only possibly having a voltage level different than that of signal A. Signal A3 may be generated as an output of a voltage level translator circuit 212, which may be included in the second stage 210 of first buffer 202. Alternatively, the voltage level translation function may be provided externally to the buffer 202, or even externally to buffer circuit 200. The voltage level translator circuit 212 preferably functions to generate the signal A3 having voltage levels suitable for use with VDD33, regardless of the voltage level of signal A. For example, if signal A is generated by core logic circuitry operating at a supply voltage of 1.0 volt, a logic high level for signal A would be about 1.0 volt. Since this voltage level is not suitable for use with first buffer 202, voltage translator circuit 212 would function to translate this 1.0 volt signal to a 3.3 volt signal suitable for use with the higher voltage supply VDD33.

When used as an output buffer, the second stage 210 of first buffer 202 is operative to receive the input signal A and to generate output signal PAD at node N1 for driving the IO pad. When used as an input buffer, an external input signal can be supplied to the first buffer 202 via the IO pad for driving first stage 208. In this instance, the second stage 210 is preferably placed in a high impedance state and is at least partially disabled. In order to conserve power in the buffer circuit 200, the first stage 208, the second stage 210, or both the first and second stages of the first buffer 202 are preferably able to be selectively turned off when not being used.

The second buffer 204 may be formed in a manner similar to first buffer 202, except that the second buffer utilizes low voltage transistors, as previous stated. Second buffer 204 preferably comprises a first stage 214 and a second stage 216 coupled to the first stage. One or both of the first and second stages 214, 216, may be configured in a manner similar to the first and second stages, respectively, of buffer 100 depicted in FIG. 1, although alternative buffer configurations are contemplated by the invention. Specifically, first stage 214 preferably comprises a pair of PMOS transistors M9 and M11, and a pair of NMOS transistors M10 and M12, which form two inverters that allow a signal generated by the second stage 216 at node N2 to drive signal Z1 generated by the first stage 214, when the buffer 204 is employed as an output buffer. A first inverter includes PMOS transistor M9 and NMOS transistor M10, and a second inverter includes PMOS transistor M11 and NMOS transistor M12. In the first inverter, a source of transistor M9 is connected to supply voltage VDD10, drains of transistors M9 and M10 are connected together at node N6, gates of M9 and M10 are connected together at node N2, and a source of M10 is connected to VSS. Likewise, in the second inverter, a source of transistor M11 is connected to VDD10, drains of transistors M11 and M12 are connected together at node N7 and generate signal Z1, gates of M11 and M12 are connected to the drains of M9 and M10 at node N6, and a source of M12 is connected to VSS.

The second stage 216 preferably includes a PMOS transistor M7 connected between node N2 and VDD10, and an NMOS transistor M8 connected between node N2 and VSS. Specifically, a source of transistor M7 is connected to VDD10, drains of transistors M7 and M8 are connected together at node N2, and a source of M8 is connected to VSS. A logical NAND gate X4 generates a control signal, P1, which is connected to a gate of transistor M7. A logical NOR gate X5 generates a control signal, N1, which is connected to a gate of transistor M8. The NAND gate X4 receives, as inputs, a data signal A1 at node N8 and an enable signal, EN1, while NOR gate X5 receives, as inputs, the data signal A1 and a logical inversion of the enable signal, EN1B, generated by an inverter X6 or an alternative inversion circuit. The inversion of the enable signal may alternatively be performed externally with respect to the second buffer 204 or to buffer circuit 200.

Data signal A1, like data signal A3 utilized in the first buffer 202, is essentially a logical equivalent of the input signal A presented to the buffer circuit 200, only possibly having a voltage level different than that of signal A. Signal A1 may be generated as an output of a voltage level translator circuit 218, which may be included in the second stage 216 of second buffer 204. Alternatively, the voltage level translation function may be provided externally to the buffer 204, or even externally to buffer circuit 200. The voltage level translator circuit 218 preferably functions to generate the signal A1 having voltage levels suitable for use with the lower supply voltage VDD10, regardless of the voltage level of signal A. For example, if signal A is generated by IO logic circuitry operating with a supply voltage of 3.3 volts, a logic high level for signal A would be about 3.3 volts. Since this voltage level is not suitable for use with second buffer 204, as this may damage the low voltage transistors comprised therein, voltage translator circuit 218 would function to translate this 3.3 volt signal to a 1.0 volt signal suitable for use with VDD10.

When used as an output buffer, the second stage 216 of second buffer 204 is operative to receive the input signal A and to generate output signal PAD1 at node N2 for driving the IO pad. When used as an input buffer, an external input signal can be supplied to the second buffer 204 via the IO pad for driving first stage 214. In this instance, the second stage 216 is preferably placed in a high impedance state and is essentially disabled. In order to conserve power in the buffer circuit 200, the first stage 214, the second stage 216, or both the first and second stages of the second buffer 204 are preferably able to be selectively turned off when not being used.

As previously explained, the second buffer 204 in buffer circuit 200 is not connected directly to the IO pad. Rather, the output signal PAD1 generated at node N2 of second buffer 204 is preferably selectively coupled to the IO pad via isolation circuit 206. In the illustrative buffer circuit 200, the isolation circuit 206 comprises a transmission gate including a high voltage NMOS transistor MT1 and a high voltage PMOS transistor MT2 coupled together in parallel, although the invention is not limited to the particular circuit arrangement shown. Specifically, a drain of transistor MT1 is connected to node N1 of first buffer 202, which is adapted for connection to the IO pad, a source of MT1 is connected to node N2 of second buffer 204, a source of transistor MT2 is connected to the drain of MT1, a drain of MT2 is connected to the source of MT1, a gate of MT1 is adapted for receiving a control signal, LV, and a gate of MT2 is adapted for receiving a logical inversion of the control signal LV, namely, control signal LVB. The transistors (e.g., MT1, MT2) in the isolation circuit 206 are preferably capable of handling the highest voltage expected by the buffer circuit 200 (e.g., about 3.3 volts) without damaging the transistors, and therefore high voltage transistors are employed.

When the buffer circuit 200 is configured to drive, for example, 3 volt signals, as may be supplied by IO circuitry, the enable signal EN3 presented to the first buffer 202 is preferably set to a logic high level and the enable signal EN1 presented to the second buffer 204 is set to a logic low level. This disables second buffer 204 and enables first buffer 202, thereby allowing signal A to drive the IO pad (signal PAD) from 0 to 3 volts through transistors M1 and M2, and logic gates X1, X2 and X3 in the first buffer, as described above. Furthermore, when buffer circuit 200 is configured for driving 3 volt signals, control signal LV is set to a logic low level and signal LVB, which is a logical inversion of signal LV, is set to a logic high level. This disables the isolation circuit 206 by turning off transistors MT1 and MT2, thereby protecting the low voltage transistors M7, M8, M9 and M10, connected to node N2, from the stress of the 3 volt signal. Since transistors M7 and M8 are turned off, node N2 will be in a high-impedance state.

Alternatively, when the buffer circuit 200 is configured to drive, for example, 1 volt signals, as may be supplied by core logic circuitry, the enable signal EN3 presented to the first buffer 202 is preferably set to a logic low level and the enable signal EN1 presented to the second buffer 204 is set to a logic high level. This disables first buffer 202 and enables second buffer 204, thereby allowing signal A to drive the IO pad (signal PAD) from 0 to 1 volt through transistors M7 and M8, and logic gates X4, X5 and X6 in the second buffer, as described above. Furthermore, when buffer circuit 200 is configured for driving 1 volt signals, control signal LV is set to a logic high level and signal LVB, which is a logical inversion of signal LV, is set to a logic low level. This enables the isolation circuit 206 by turning on transistors MT1 and MT2, thereby connecting node N2 directly to the IO pad. Since transistors M1 and M2 are turned off, node N1, which connects to the IO pad, will be in a high-impedance state, thereby isolating node N2 from receiving any 3 volt signals.

Since the signal LV which controls transistor MT1 in isolation circuit 206 is preferably a 3 volt signal, MT1 will allow a high frequency 1 volt signal to pass through it. In fact, it is contemplated that transistor MT2 is not needed at all and can therefore be omitted, since the common mode range of the signal PAD1 generated at node N2 of the second buffer 204 can be handled by MT1 alone for certain applications, depending on the voltage levels selected. For certain other applications, isolation circuit 206 may be modified to handle voltages higher than 3 volts, such as, for example, by employing two or more transmission gates connected together in series between nodes N2 and N1. Again, the isolation circuit 206 may comprise two or more NMOS transistors connected in series, rather than employing a full transmission gate including both NMOS and PMOS devices connected in parallel, as will be understood by those skilled in the art.

Figure 3:
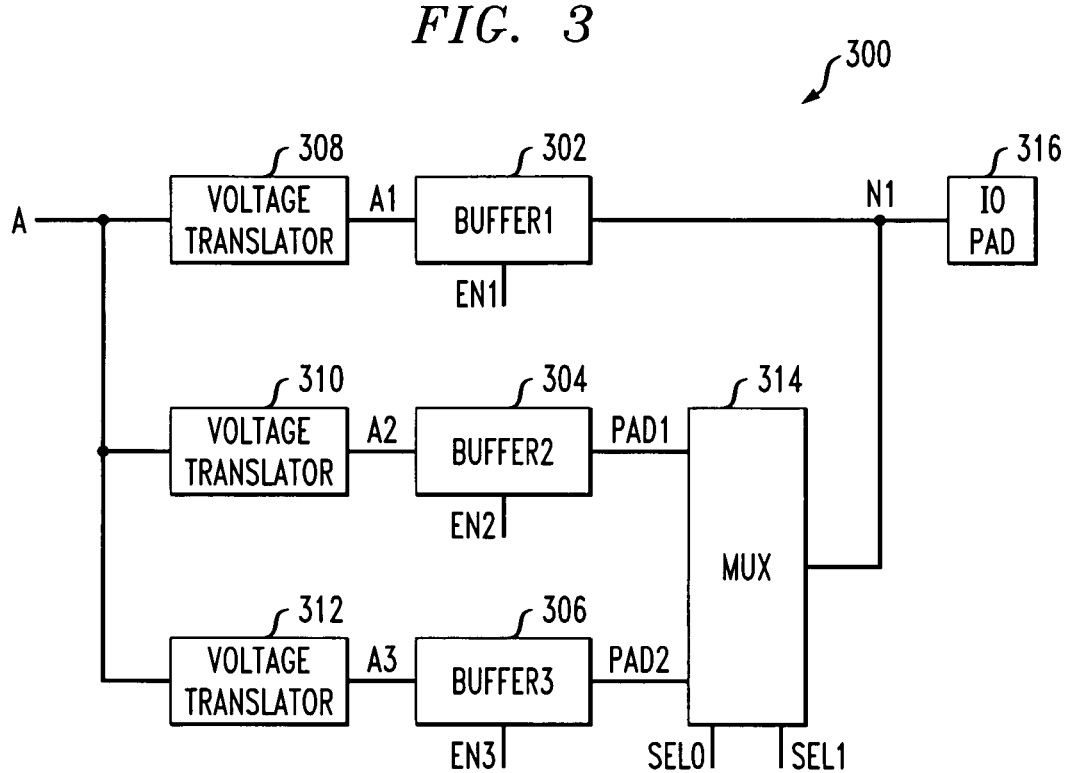
FIG. 3 is a schematic diagram depicting at least a portion of an exemplary bidirectional buffer circuit, formed in accordance with another embodiment of the present invention.

FIG. 3 is a block diagram depicting an exemplary bidirectional buffer circuit 300 adapted for handling three voltage levels, such as, but not limited to, 1.0 volt, 1.8 volts and 3.3 volts, in accordance with another embodiment of the invention. Modern semiconductor foundries often allow mixing 1.0 volt, 1.8 volt, and 3.3 volt transistors on a single integrated circuit, generally without any significant modification to the fabrication process, so this is a viable expansion of the techniques of the present invention described herein. As previously stated, the invention is not limited to any particular number and/or values of voltage levels employed.

Buffer circuit 300 comprises a first buffer (BUFFER1) 302, a second buffer (BUFFER2) 304 and a third buffer (BUFFER3) 306, connected in parallel with one another. Each of the buffers 302, 304, 306, may be formed in manner consistent with the buffer circuits 202, 204 shown in FIG. 2, although any suitable buffer may be employed, as will become apparent to those skilled in the art. By way of example only, and without loss of generality, first buffer 302 utilizes 3 volt transistors and is adapted to drive 3.3 volt signals, second buffer 304 utilizes 1.8 volt transistors and is adapted to drive 1.8 volt signals, and third buffer 306 utilizes 1.0 volt transistors and is adapted to drive 1.0 volt signals. The buffer which is adapted for handling the highest expected voltage level, in this instance buffer 302, is preferably coupled directly to an IO pad 316, or an alternative external connection of the buffer circuit 300, at node N1. The remaining buffers 304, 306 are isolated from the IO pad 316, and thus the respective transistors in buffers 304, 306 are isolated from receiving the stress of the higher voltage level, by a multiplexer (MUX) 314, or alternatively switching circuitry.

Specifically, a first input of the MUX 314 is adapted to receive an output signal, PAD1, generated by buffer 304, and a second input of the MUX is adapted to receive an output signal, PAD2, generated by buffer 306. An output of the MUX 314 is connected to the IO pad 316 at node N1. The MUX 314 functions primarily to selectively connect either second buffer 304 or third buffer 306 to the IO pad 316 in response to control signals, SEL0 and SEL1, supplied to the MUX, as well to isolate buffers 304 and 306 from receiving the higher voltage levels, as previously stated.

Buffer circuit 300 may include one or more voltage translator circuits, 308, 310 and 312, connected to a corresponding buffer 302, 304 and 306, respectively. Each of the voltage translator circuits 308, 310, 312, is preferably adapted to receive an input signal, A, supplied to the buffer circuit 300, and generates a corresponding signal, A1, A2 and A3, which are preferably logical equivalents of signal A, but have magnitudes suitable for driving buffers 302, 304 and 308, respectively. For example, if signal A is generated by circuitry operating at a supply voltage of 1.8 volts, a logic high level for signal A would be about 1.8 volts. Since this voltage level is not suitable for use with first buffer 302, voltage translator circuit 308 would function to translate this 1.8 volt signal to a 3.3 volt signal (A1) suitable for use with buffer 302. Likewise, voltage translator 312 would function to translate the 1.8 volt signal to a 1.0 volt signal (A3) suitable for use with buffer 306. In this instance, buffer 304, which is adapted for use with 1.8 volt signals, would not require voltage level translation of the input signal A, and therefore voltage translator circuit 310 may be omitted from buffer circuit 300. Alternatively, if signal A is referenced with respect to a 3.3 volt source, a logic high level for signal A would be about 3.3 volts. Since this voltage level is not suitable for use with second buffer 304 or third buffer 306, voltage translator circuits 310 and 312 would function to translate this 3.3 volt signal to a 1.8 volt signal (A2) or a 1.0 volt signal (A3) suitable for use with either buffer 304 or buffer 306, respectively. In this instance, buffer 302, which is adapted for use with 3.3 volt signals, would not require voltage level translation of the input signal A, and therefore voltage translator circuit 308 may be omitted from buffer circuit 300.

When the buffer circuit 300 is configured to drive, for example, 3.3 volt signals, the enable signal EN1 to the first buffer 302 is preferably set to a logic high level and the enable signals EN2 and EN3 to the second and third buffers 304, 306, respectively, are set to a logic low level. This disables the second and third buffers 304, 306, and enables first buffer 302, thereby allowing signal A to drive the IO pad 316 from 0 to 3.3 volts via buffer 302. The outputs of buffer 304 and 306 are preferably in a high-impedance state.

Furthermore, when buffer circuit 300 is configured for driving 3.3 volt signals, control signals SEL0 and SEL1 are set to a logic low level so as to disable the MUX 314, thereby protecting the transistors in buffers 304 and 306 from the stress of the 3.3 volt signal. With MUX 314 disabled, its output, which is connected to the IO pad 316 at node N1, is preferably in a high-impedance state.

When the buffer circuit 300 is configured to drive, for example, 1.8 volt signals, the enable signals EN1 and EN3 to the first and third buffers 302, 306, respectively, are preferably set to a logic low level and the enable signal EN2 to the second buffer 304 is set to a logic high level. This disables first and third buffers 302, 306 and enables second buffer 304. Furthermore, control signal SEL0 is preferably set to a logic high level and control signal SEL1 is set to a logic low level, thereby connecting the output of second buffer 304 to the IO pad 316. Thus, signal A drives the IO pad 316 from 0 to 1.8 volts through second buffer 304 and MUX 314. The outputs of buffers 302 and 306 are preferably in a high-impedance state. Moreover, MUX 314 is configured to isolate third buffer 306 from receiving any 1.8 volt signals.

Likewise, when the buffer circuit 300 is configured to drive, for example, 1.0 volt signals, the enable signals EN1 and EN2 to the first and second buffers 302, 304, respectively, are preferably set to a logic low level and the enable signal EN3 to the third buffer 304 is set to a logic high level. This disables first and second buffers 302, 304 and enables third buffer 306. Control signal SEL1 is preferably set to a logic high level and control signal SEL0 is set to a logic low level, thereby connecting the output of third buffer 306 to the IO pad 316. Thus, signal A drives the IO pad 316 from 0 to 1.0 volt through third buffer 306 and MUX 314. The outputs of buffers 302 and 304 are preferably in a high-impedance state.

At least a portion of the buffer circuits of the present invention may be implemented in an integrated circuit. In forming integrated circuits, a plurality of identical die is typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A buffer circuit, comprising:
   a first buffer configured for operation with a first voltage supply having a first voltage level, an output node of the first buffer connected directly to an external pad of the buffer circuit, the first buffer being adapted to receive one of an input signal to the buffer circuit and a first signal indicative of the input signal and to generate a first output signal which is a function of the input signal, the first output signal being referenced to the first voltage level;
   a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the output node of the second buffer is in a high-impedance state during the first mode, and the output node of the first buffer is in a high-impedance state during the second mode.

2. The circuit of claim 1, wherein the second buffer is at least partially disabled and the first buffer is enabled during the first mode, and wherein the second buffer is enabled and the first buffer is at least partially disabled during the second mode.

3. The circuit of claim 1, wherein at least one of the first and second buffers comprises a voltage level translator circuit adapted to receive the input signal and to generate at least one of the first signal indicative of the input signal and the second signal indicative of the input signal, respectively.

4. The circuit of claim 1, wherein at least one of the first and second buffers is a bi-directional buffer.

5. The circuit of claim 1, further comprising at least one voltage level translator circuit adapted to receive the input signal and to generate at least one of the first signal indicative of the input signal and the second signal indicative of the input signal.

6. The circuit of claim 1, wherein the isolation circuit comprises at least first and second n-type transistors, a first bias terminal of the first transistor being connected to the output node of the second buffer, a second bias terminal of the first transistor being connected to a first bias terminal of the second transistor, a second bias terminal of the second transistor being connected to the output node of the first buffer, and control terminals of the first and second transistors being adapted to receive the first control signal.

7. The circuit of claim 6, wherein the at least one of the first and second transistors comprises a high voltage NMOS transistor.

8. The circuit of claim 1, wherein the second voltage level is about 1.0 volt and the first voltage level is about 3.3 volts.

9. A buffer circuit, comprising:

a first buffer configured for operation with a first voltage supply having a first voltage level, an output node of the first buffer connected to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the first buffer comprises:

a first stage including first and second inverters, an input of the first inverter being connected to the output node of the first buffer, an output of the first inverter being connected to an input of the second inverter, and an output of the second inverter generating a signal indicative of the signal at the output node of the first buffer, the first and second inverters comprising transistors having a first threshold voltage associated therewith, the first threshold voltage being greater than a second threshold voltage associated with transistors in the second buffer; and a second stage including a p-type transistor device having a first bias terminal adapted for connection to the first voltage source, a second bias terminal connected to the output node of the first buffer, and a control terminal adapted for receiving a second control signal, and an n-type transistor device having a first bias terminal adapted for connection to a third voltage source supplying a third voltage level, a second bias terminal connected to the output node of the first buffer, and a control terminal adapted for receiving a third control signal, the n-type and p-type transistors having the first threshold voltage associated therewith;

wherein the second and third control signals are operative in the second mode to turn off the p-type transistor and the n-type transistor, and the second and third control signals are operative in the first mode to turn the p-type transistor and the n-type transistor on or off as a function of the input signal to the buffer circuit.

10. A buffer circuit, comprising:

a first buffer configured for operation with a first voltage supply having a first voltage level, an output node of the first buffer connected to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the first buffer comprises:
  a first stage including first and second inverters, an input of the first inverter being connected to the output node of the first buffer, an output of the first inverter being connected to an input of the second inverter, and an output of the second inverter generating a signal indicative of the signal at the output node of the first buffer, the first and second inverters comprising transistors having a first threshold voltage associated therewith, the first threshold voltage being greater than a second threshold voltage associated with transistors in the second buffer; and
  a second stage comprising:
    a p-type transistor device having a first bias terminal adapted for connection to the first voltage source, a second bias terminal connected to the output node of the first buffer, and a control terminal adapted for receiving a second control signal, the p-type transistor having the first threshold voltage associated therewith;
    an n-type transistor device having a first bias terminal adapted for connection to a third voltage source supplying a third voltage level, a second bias terminal connected to the output node of the first buffer, and a control terminal adapted for receiving a third control signal, the n-type transistor having the first threshold voltage associated therewith;
    a logical NAND gate having a first input adapted to receive a fourth control signal, a second input adapted to receive the first signal indicative of the input signal, and an output for generating the second control signal; and
    a logical NOR gate having a first input adapted to receive a logical inversion of the fourth control signal, a second input connected to the second input of the NAND gate, and an output for generating the third control signal.

11. The circuit of claim 10, wherein the second stage of the first buffer further comprises a voltage level translator circuit adapted to receive the input signal and to generate the first signal indicative of the input signal.

12. A buffer circuit, comprising:
a first buffer configured for operation with a first voltage supply having a first voltage level, an output node of the first buffer connected to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the second buffer comprises:
  a first stage including first and second inverters, an input of the first inverter being connected to the output node of the second buffer, an output of the first inverter being connected to an input of the second inverter, and an output of the second inverter generating a signal indicative of the signal at the output node of the second buffer, the first and second inverters comprising transistors having a second threshold voltage associated therewith, the second threshold voltage being less than a first threshold voltage associated with transistors in the first buffer; and
  a second stage including a p-type transistor device having a first bias terminal adapted for connection to the second voltage source, a second bias terminal connected to the output node of the second buffer, and a control terminal adapted for receiving a second control signal, and an n-type transistor device having a first bias terminal adapted for connection to a third voltage source supplying a third voltage level, a second bias terminal connected to the output node of the second buffer, and a control terminal adapted for receiving a third control signal, the n-type and p-type transistors having the second threshold voltage associated therewith;
  wherein the second and third control signals are operative in the first mode to turn off the p-type transistor and the n-type transistor, and the second and third control signals are operative in the second mode to turn the p-type transistor and the n-type transistor on or off as a function of the input signal to the buffer circuit.

13. A buffer circuit, comprising:
a first buffer configured for operation with a first voltage supply having a first voltage level, an output node of the first buffer connected to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the second buffer comprises:

a first stage including first and second inverters, an input of the first inverter being connected to the output node of the second buffer, an output of the first inverter being connected to an input of the second inverter, and an output of the second inverter generating a signal indicative of the signal at the output node of the second buffer, the first and second inverters comprising transistors having a second threshold voltage associated therewith, the second threshold voltage being less than a first threshold voltage associated with transistors in the first buffer; and a second stage, comprising:

a p-type transistor device having a first bias terminal adapted for connection to the second voltage source, a second bias terminal connected to the output node of the second buffer, and a control terminal adapted for receiving a second control signal, the p-type transistor having the second threshold voltage associated therewith;

an n-type transistor device having a first bias terminal adapted for connection to a third voltage source supplying a third voltage level, a second bias terminal connected to the output node of the second buffer, and a control terminal adapted for receiving a third control signal, the n-type transistor having the second threshold voltage associated therewith;

a logical NAND gate having a first input adapted to receive a fourth control signal, a second input adapted to receive the second signal indicative of the input signal, and an output for generating the second control signal; and a logical NOR gate having a first input adapted to receive a logical inversion of the fourth control signal, a second input connected to the second input of the NAND gate, and an output for generating the third control signal.

14. The circuit of claim 13, wherein the second stage of the second buffer further comprises a voltage level translator circuit adapted to receive the input signal and to generate the second signal indicative of the input signal.

15. A buffer circuit, comprising:

a first buffer configured for operation with a first voltage supply having a first voltage level, an output node of the first buffer connected directly to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the isolation circuit comprises at least one transmission gate, the at least one transmission gate including:

an n-type transistor having a first bias terminal connected to the output node of the second buffer, a second bias terminal connected to the output node of the first buffer, and a control terminal adapted to received the first control signal; and a p-type transistor having a first bias terminal connected to the output node of the first buffer, a second bias terminal connected to the output node of the second buffer, and a control terminal adapted to received a logical inversion of the first control signal;

wherein the n-type and p-type transistors have a threshold voltage associated therewith which is greater than a threshold voltage of one or more transistors in the second buffer.

16. A buffer circuit, comprising:

a first buffer configured for operation with a first voltage supply having a first voltage level, an output node of the first buffer connected directly to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the isolation circuit comprises a multiplexer.

17. A buffer circuit, comprising:

a first buffer configured for operation with a first voltage supply having a first voltage level, an output node of the first buffer connected directly to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level;

a third buffer configured for operation with a third voltage supply having a third voltage level, the third buffer being adapted to receive a third signal indicative of the input signal and to generate a third output signal which is a function of the input signal, the third output signal being referenced to the third voltage level; and a controllable isolation circuit coupled between an output node of the second buffer and the external pad;

wherein the buffer circuit is selectively operative in one of at least a first mode, a second mode and a third mode in response to at least the first control signal and a second control signal, the isolation circuit: (i) being operative in the first mode to substantially isolate the second and third buffers from the external pad; (ii) being operative in the second mode to isolate the third buffer from the external pad and to connect the output node of the second buffer to the external pad; and (iii) being operative in the third mode to isolate the second buffer from the external pad and to connect the output node of the third buffer to the external pad, the external pad being driven by the first output signal in the first mode, being driven by the second output signal in the second mode, and being driven by the third output signal in the third mode.

18. An integrated circuit including at least one buffer circuit, the at least one buffer circuit comprising:

a first buffer configured for operation with a first voltage supply having a first voltage level, an output node of the first buffer connected directly to an external pad of the buffer circuit, the first buffer being adapted to receive one of an input signal to the buffer circuit and a first signal indicative of the input signal and to generate a first output signal which is a function of the input signal, the first output signal being referenced to the first voltage level;

a second buffer configured for operation with a second voltage supply having a second voltage level, the first voltage level being greater than the second voltage level, the second buffer being adapted to receive one of the input signal and a second signal indicative of the input signal and to generate a second output signal which is a function of the input signal, the second output signal being referenced to the second voltage level; and a controllable isolation circuit coupled between an output node of the second buffer and the external pad;

wherein the at least one buffer circuit is selectively operative in one of at least a first mode and a second mode in response to at least a first control signal, the isolation circuit being operative in the first mode to substantially isolate the second buffer from the external pad and being operative in the second mode to connect the output node of the second buffer to the external pad, the external pad being driven by the first output signal in the first mode and being driven by the second output signal in the second mode;

wherein the output node of the second buffer is in a high-impedance state during the first mode, and the output node of the first buffer is in a high-impedance state during the second mode.

19. The integrated circuit of claim 18, wherein the second buffer is at least partially disabled and the first buffer is enabled during the first mode, and wherein the second buffer is enabled and the first buffer is at least partially disabled during the second mode.

\* \* \* \* \*